United States Patent
Huang

(10) Patent No.: US 9,934,744 B2
(45) Date of Patent: Apr. 3, 2018

(54) SHIFT REGISTER, GATE DRIVER CIRCUIT, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 136 days.

(21) Appl. No.: 14/904,816

(22) PCT Filed: Jul. 24, 2015

(86) PCT No.: PCT/CN2015/084995
§ 371 (c)(1),
(2) Date: Jan. 13, 2016

(87) PCT Pub. No.: WO2016/150053
PCT Pub. Date: Sep. 29, 2016

(65) Prior Publication Data
US 2017/0256220 A1    Sep. 7, 2017

(30) Foreign Application Priority Data

Mar. 26, 2015   (CN) .......................... 2015 1 0137070

(51) Int. Cl.
*G09G 3/36*      (2006.01)

(52) U.S. Cl.
CPC ... *G09G 3/3677* (2013.01); *G09G 2310/0286* (2013.01); *G09G 2310/08* (2013.01); *G09G 2330/021* (2013.01)

(58) Field of Classification Search
None
See application file for complete search history.

(56) References Cited

U.S. PATENT DOCUMENTS

2010/0201659 A1   8/2010   Miyake et al.
2012/0139883 A1   6/2012   Lee et al.
(Continued)

FOREIGN PATENT DOCUMENTS

CN     1504989 A    6/2004
CN     1705042 A    12/2005
(Continued)

OTHER PUBLICATIONS

First Office Action regarding Chinese application No. 201510137070.6, dated Sep. 29, 2016. Translation provided by Dragon Intellectual Property Law Firm.
(Continued)

*Primary Examiner* — Joseph Haley
(74) *Attorney, Agent, or Firm* — Harness, Dickey & Pierce, P.L.C.

(57) ABSTRACT

A shift register includes an input module, a first and a second node pull-down module, a second node pull-up module, an output control module and an output noise-reduction module. The input module is configured to pull up a potential at a first node, the first node pull-down module is configured to pull down the potential at the first node, the second node pull-up module is configured to pull up a potential at a second node, the second node pull-down module is configured to pull down the potential at the second node, the output control module is configured to control a scanning signal
(Continued)

output end to output a signal from the second lock signal end or a low level signal end, and the output noise-reduction module is configured to filter a signal from the first node and decrease a noise therein and output the resultant signal to a third node.

22 Claims, 6 Drawing Sheets

(56) References Cited

U.S. PATENT DOCUMENTS

| 2013/0027377 A1* | 1/2013 | Yang | G09G 3/3677 |
| | | | 345/212 |
| 2013/0181747 A1* | 7/2013 | Yoon | G11C 19/184 |
| | | | 327/108 |
| 2015/0042689 A1* | 2/2015 | Kim | H03K 3/012 |
| | | | 345/690 |

FOREIGN PATENT DOCUMENTS

| CN | 104217693 A | 12/2014 |
| CN | 104778928 A | 7/2015 |
| JP | 3809750 B2 | 8/2006 |
| KR | 20090113738 A | 11/2009 |

OTHER PUBLICATIONS

Written Opinion of the International Searching Authority for international application No. PCT/CN2015/084995.

* cited by examiner

SHIFT REGISTER, GATE DRIVER CIRCUIT, DISPLAY PANEL AND DISPLAY DEVICE

CROSS-REFERENCE TO RELATED APPLICATION

The present application is the U.S. national phase of PCT Application No. PCT/CN2015/084995 filed on Jul. 24, 2015, which claims a priority of the Chinese patent application No. 201510137070.6 filed on Mar. 26, 2015, both of which are incorporated herein by reference in their entirety.

TECHNICAL FIELD

The present disclosure relates to the field of display technology, in particular to a shift register, a gate driver circuit, a display panel and a display device.

BACKGROUND

Recently, along with the development of the liquid crystal display technologies, the competition in the liquid crystal panel industry becomes more and more fierce, so how to reduce the production cost of the liquid crystal display panel has become a leading option for manufacturers. In order to reduce the production cost, a gate driver circuit is generally arranged at a peripheral portion of a display panel. The gate driver circuit includes a plurality of shift registers, and each shift register corresponds to one gate line. These shift registers are connected in series, and there is a triggering signal transmitting from level to level between any two adjacent shift registers. Upon receiving the triggering signal, each shift register outputs a gate scanning signal to the corresponding gate line, and meanwhile transmits the triggering signal to a next-level unit circuit, so as to achieve a gate-driving function. In this way, it is unnecessary to provide a gate driver IC separately at a bezel region of the display panel, thereby to provide the display panel with a narrow bezel, reduce the production cost and improve the market competitiveness of the product.

Usually, an existing shift register has a circuit structure as shown in FIG. 1 and FIG. 2 shows a corresponding input/output sequence diagram. As shown in FIG. 2, when the shift register is normally turned on, a potential at a first node PU is pulled up within a first stage, and continues to be pulled up within a second stage, so as to turn on a switching transistor T7, thereby to enable a scanning signal output end to output a scanning signal. However, the first node PU outputs a voltage signal including noise (e.g., region A in FIG. 2), and a signal generated when the potential at the first node PU is pulled up at the first time has a relatively high potential, so during the charging and discharging by a capacitor C1, the scanning signal from the scanning signal output end may include a relatively large noise (e.g., region B in FIG. 2), resulting in a large power consumption for the circuit of the shift register as well as a reduced yield of the display panel.

Hence, there is an urgent need to reduce the noise included in the scanning signal from the shift register as well as the power consumption, thereby to improve the yield.

SUMMARY

An object of the present disclosure is to provide a shift register, a gate driver circuit, a display panel and a display device, so as to reduce a noise included in a scanning signal from the shift register as well as the power consumption.

In one aspect, the present disclosure provides a shift register, including an input module, a first node pull-down module, a second node pull-up module, a second node pull-down module, an output control module and an output noise-reduction module. A first input end of the input module is connected to a first signal input end, a second input end of the input module is connected to a second signal input end, a first control end of the input module is connected to a first reference signal end, a second control end of the input module is connected to a second reference signal end, an output end of the input module is connected to a first node, and the input module is configured to pull up a potential at the first node under the control of the first reference signal end or the second reference signal end. An input end of the first node pull-down module is connected to a low level signal end, a control end of the first node pull-down module is connected to a second node, an output end of the first node pull-down module is connected to the first node, and the first node pull-down module is configured to pull down the potential at the first node under the control of the second node. An input end of the second node pull-up module is connected to a high level signal end, a control end of the second node pull-up module is connected to a first clock signal end, an output end of the second node pull-up module is connected to the second node, and the second node pull-up module is configured to pull up a potential at the second node under the control of the first clock signal end. A first input end and a second input end of the second node pull-down module are connected to the low level signal end, a first control end of the second node pull-down module is connected to the first node, a second control end of the second node pull-down module is connected to a scanning signal output end, an output end of the second node pull-down module is connected to the second node, and the second node pull-down module is configured to pull down the potential at the second node under the control of the first node or the scanning signal output end. A first input end of the output control module is connected to the low level signal end, a second input end of the output control module is connected to a second clock signal end, a first control end of the output control module is connected to a third node, a second control end of the output control module is connected to the second node, an output end of the output control module is connected to the scanning signal output end, and the output control module is configured to control the scanning signal output end to output a signal from the second clock signal end or a signal from the low level signal end under the control of the third node or the second node. An input end of the output noise-reduction module is connected to the first node, a control end of the output noise-reduction module is connected to the high level signal end, an output end of the output noise-reduction module is connected to the third node, and the output noise-reduction module is configured to filter a signal from the first node and decrease a noise included in the signal, and then output the resultant signal to the third node.

Alternatively, the output noise-reduction module includes a first switching transistor, a gate electrode of which is connected to the high level signal end, a source electrode of which is connected to the first node, and a drain electrode of which is connected to the third node.

Alternatively, the shift register further includes a first node noise-reduction module connected among the first node, the high level signal end and the source electrode of the first switching transistor and configured to further filter the signal from the first node and decrease the noise included in the signal, and then output the resultant signal to the source electrode of the first switching transistor.

Alternatively, the first node noise-reduction module includes a second switching transistor and a third switching transistor. A gate electrode of the second switching transistor is connected to the first node, a source electrode of the second switching transistor is connected to a drain electrode of the third switching transistor, and a drain electrode of the second switching transistor is connected to the source electrode of the first switching transistor. A gate electrode and a source electrode of the third switching transistor are connected to the high level signal end.

Alternatively, the shift register further includes a second node noise-reduction module connected among the high level signal end, the output end of the second node pull-up module and the second node and configured to filter and a signal from the output end of the second node pull-up module and decrease the noise included in the signal, and output the resultant signal to the second node.

Alternatively, the second node noise-reduction module includes a fourth switching transistor, a gate electrode of which is connected to the high level signal end, a source electrode of which is connected to the output end of the second node pull-up module and a drain electrode of which is connected to the second node.

Alternatively, the second node pull-up module includes a fifth switching transistor, a gate electrode of which is connected to the first clock signal end, a source electrode of which is connected to the high level signal end, and a drain electrode of which is connected to the source electrode of the fourth switching transistor.

Alternatively, the shift register further includes a protection module connected among the first signal input end, the second signal input end, the high level signal end and the output end of the second node pull-up module, and configured to divert an abnormal current signal when the abnormal current signal is inputted by the first signal input end or the second signal input end.

Alternatively, the protection module includes a sixth switching transistor and a seventh switching transistor. A gate electrode of the sixth switching transistor is connected to the first signal input end, a source electrode of the sixth switching transistor is connected to the high level signal end, and a drain electrode of the sixth switching transistor is connected to a source electrode of the seventh switching transistor. A gate electrode of the seventh switching transistor is connected to the second signal input end, and a drain electrode of the seventh switching transistor is connected to the output end of the second node pull-up module.

Alternatively, the shift register further includes a maintenance module. An input end of the maintenance module is connected to the high level signal end, a control end and an output end of the maintenance module are connected to the scanning signal output end, and the maintenance module is configured to maintain a potential at the scanning signal output end when the scanning signal output end outputs the scanning signal.

Alternatively, the maintenance module includes an eighth switching transistor, a gate electrode and a drain electrode of which are connected to the scanning signal output end, and a source electrode of which is connected to the high level signal end.

Alternatively, the output control module includes a first output control module and a second output control module. The first output control module is connected among the third node, the second clock signal end and the scanning signal output end, and configured to control the scanning signal output end to output a signal from the second clock signal end under the control of the third node. The second output control module is connected among the low level signal end, the second node and the scanning signal output end, and configured to control the scanning signal output end to output a signal from the low level signal end under the control of the second node.

Alternatively, the first output control module includes a ninth switching transistor and a first capacitor. A gate electrode of the ninth switching transistor is connected to the third node, a source electrode of the ninth switching transistor is connected to the second clock signal end, and a drain electrode of the ninth switching transistor is connected to the scanning signal output end. The first capacitor is connected between the third node and the scanning signal output end.

Alternatively, the second output control module includes a tenth switching transistor, a gate electrode of which is connected to the second node, a source electrode of which is connected to the low level signal end, and a drain electrode of which is connected to the scanning signal output end.

Alternatively, the second output control module further includes a second capacitor connected between the second node and the low level signal end.

Alternatively, the second node pull-down module includes a first pull-down module and a second pull-down module. An input end of the first pull-down module is connected to the low level signal end, a control end of the first pull-down module is connected to the first node, an output end of the first pull-down module is connected to the second node, and the first pull-down module is configured to pull down the potential at the second node under the control of the first node. An input end of the second pull-down module is connected to the low level signal end, a control end of the second pull-down module is connected to the scanning signal output end, an output end of the second pull-down module is connected to the second node, and the second pull-down module is configured to further pull down the potential at the second node when the scanning signal output end outputs the scanning signal.

Alternatively, the first pull-down module includes an eleventh switching transistor, a gate electrode of which is connected to the first node, a source electrode of which is connected to the low level signal end, and a drain electrode of which is connected to the second node.

Alternatively, the second pull-down module includes a twelfth switching transistor, a gate electrode of which is connected to the scanning signal output end, a source electrode of which is connected to the low level signal end, and a drain electrode of which is connected to the second node.

Alternatively, the input module includes a thirteenth switching transistor and a fourteenth switching transistor. A gate electrode of the thirteenth switching transistor is connected to the first reference signal end, a source electrode of the thirteenth switching transistor is connected to the first signal input end, and a drain electrode of the thirteenth switching transistor is connected to a source electrode of the fourteenth switching transistor and the first node. A gate electrode of the fourteenth switching transistor is connected to the second reference signal end, and a drain electrode of the fourteenth switching transistor is connected to the second signal input end.

Alternatively, the first node pull-down module includes a fifteenth switching transistor, a gate electrode of which is connected to the output end of the second node pull-up module, a source electrode of which is connected to the low level signal end, and a drain electrode of which is connected to the input end of the output noise-reduction module.

In another aspect, the present disclosure provides in some embodiments a gate driver circuit including a plurality of the above-mentioned shift registers arranged in a cascaded manner, and apart from the last shift register, a triggering signal is inputted by a scanning signal output end of each shift register into a signal input end of a next shift register.

In yet another aspect, the present disclosure provides in some embodiments a display panel including the above-mentioned gate driver circuit.

In still yet another aspect, the present disclosure provides in some embodiments a display device including the above-mentioned display panel.

According to the shift register, the gate driver circuit, the display panel and the display device in the embodiments of the present disclosure, the shift register includes the input module, the first node pull-down module, the second node pull-up module, the second node pull-down module, the output control module and the output noise-reduction module. The input module is configured to pull up the potential at the first node under the control of the first reference signal end or the second reference signal end. The first node pull-down module is configured to pull down the potential at the first node under the control of the second node. The second node pull-up module is configured to pull up the potential at the second node under the control of the first clock signal end. The second node pull-down module is configured to pull down the potential at the second node under the control of the first node and the scanning signal output end. The output control module is configured to control the scanning signal output end to output the signal from the second clock signal end or the signal from the low level signal end under the control of the third node and the second node. In this way, it is able for the shift register to output the scanning signal at a corresponding stage. Meanwhile, the output noise-reduction module is configured to filter the signal from the first node and decrease the noise included in the signal, and output the resultant signal to the third node, so as to enable the output control module to output a low-noise scanning signal under the control of the third node, and prevent the scanning signal output end from outputting a noisy signal under the control of the first capacitor in the presence of the noisy signal. As a result, it is able to achieve the loss-free transmission of the signal and reduce the power consumption, thereby to improve the yield of the display panel.

DETAILED DESCRIPTION

The present disclosure will be described hereinafter in conjunction with the drawings and embodiments.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
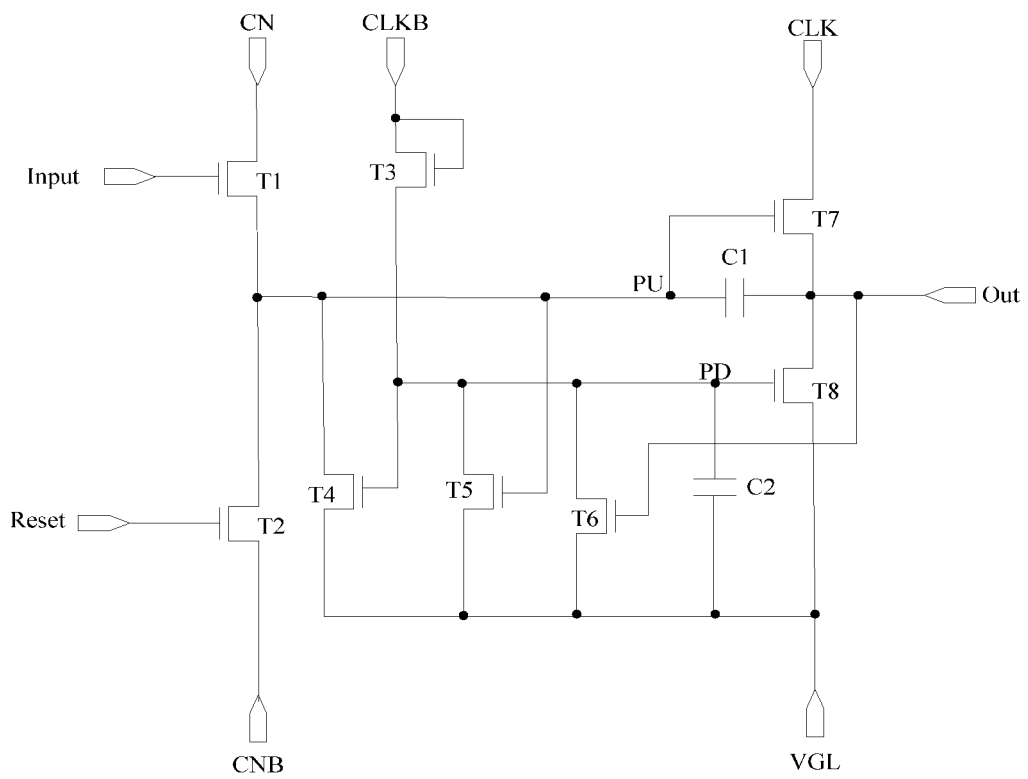
FIG. 1 is a schematic view showing an existing shift register.
Figure 2:
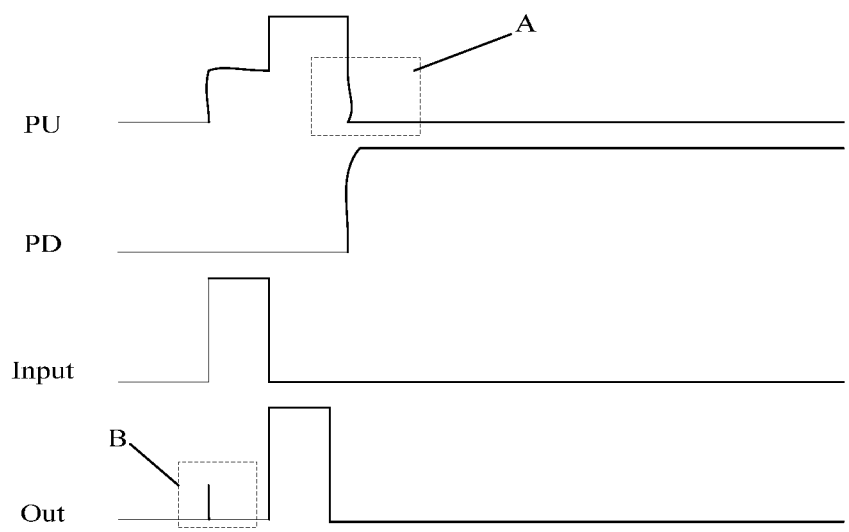
FIG. 2 is an input/output sequence diagram of the existing shift register.
Figure 3:
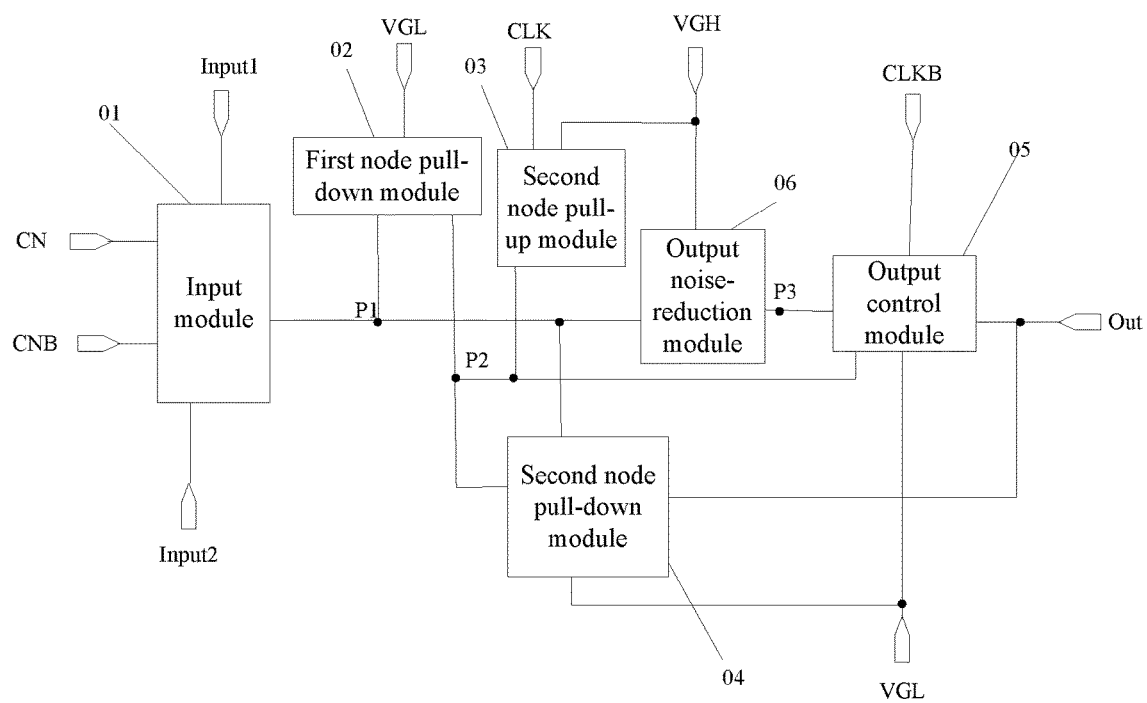
FIG. 3 is a schematic view showing a shift register according to some embodiments of the present disclosure.

The present disclosure provides in some embodiments a shift register which, as shown in FIG. 3, may include an input module 01, a first node pull-down module 02, a second node pull-up module 03, a second node pull-down module 04, an output control module 05 and an output noise-reduction module 06.

A first input end of the input module 01 is connected to a first signal input end Input1, a second input end of the input module 01 is connected to a second signal input end Input2, a first control end of the input module 01 is connected to a first reference signal end CN, a second control end of the input module 01 is connected to a second reference signal end CNB, an output end of the input module is connected to a first node P1, and the input module 01 is configured to pull up a potential at the first node P1 under the control of the first reference signal end CN or the second reference signal end CNB.

An input end of the first node pull-down module 02 is connected to a low level signal end VGL, a control end of the first node pull-down module 02 is connected to a second node P2, an output end of the first node pull-down module 02 is connected to the first node P1, and the first node pull-down module 02 is configured to pull down the potential at the first node P1 under the control of the second node P2.

An input end of the second node pull-up module 03 is connected to a high level signal end VGH, a control end of the second node pull-up module 03 is connected to a first clock signal end CLK, an output end of the second node pull-up module 03 is connected to the second node P2, and the second node pull-up module 03 is configured to pull up a potential at the second node P2 under the control of the first clock signal end CLK.

A first input end and a second input end of the second node pull-down module 04 are connected to the low level signal end VGL, a first control end of the second node pull-down module 04 is connected to the first node P1, a second control end of the second node pull-down module 04 is connected to a scanning signal output end Out, an output end of the second node pull-down module 04 is connected to the second node P2, and the second node pull-down module 04 is configured to pull down the potential at the second node P2 under the control of the first node P1 or the scanning signal output end Out.

A first input end of the output control module 05 is connected to the low level signal end VGL, a second input end of the output control module 05 is connected to a second clock signal end CLKB, a first control end of the output control module 05 is connected to a third node P3, a second control end of the output control module 05 is connected to the second node P2, an output end of the output control module 05 is connected to the scanning signal output end Out, and the output control module 05 is configured to control the scanning signal output end Out to output a signal from the second clock signal end CLKB or a signal from the low level signal end VGL under the control of the third node P3 or the second node P2.

An input end of the output noise-reduction module 06 is connected to the first node P1, a control end of the output noise-reduction module 06 is connected to the high level signal end VGH, an output end of the output noise-reduction module 06 is connected to the third node P3, and the output noise-reduction module 06 is configured to filter a signal from the first node P1 and decrease noise included in the signal and then output the resultant signal to the third node P3.

According to the embodiments of the present disclosure, the shift register includes the input module 01, the first node pull-down module 02, the second node pull-up module 03, the second node pull-down module 04, the output control module 05 and the output noise-reduction module 06. The input module 01 is configured to pull up the potential at the first node P1. The first node pull-down module 02 is configured to pull down the potential at the first node P1. The second node pull-up module 03 is configured to pull up the potential at the second node P2. The second node pull-down module 04 is configured to pull down the potential at the second node P2. The output control module 05 is configured to control the scanning signal output end Out to output the signal from the second clock signal end CLKB or the signal from the low level signal end VGL. In this way, it is able for the shift register to output the scanning signal at a corresponding stage. Meanwhile, the output noise-reduction module is configured to filter the signal from the first node and decrease noise included in the signal, and output the resultant signal to the third node, so as to enable the output control module to output a low-noise scanning signal under the control of the third node, and prevent the scanning signal output end from outputting a noisy signal under the control of the first capacitor in the presence of the noisy signal. As a result, it is able to achieve the loss-free transmission of the signal and reduce the power consumption, thereby to improve the yield of the display panel.

Figure 4:
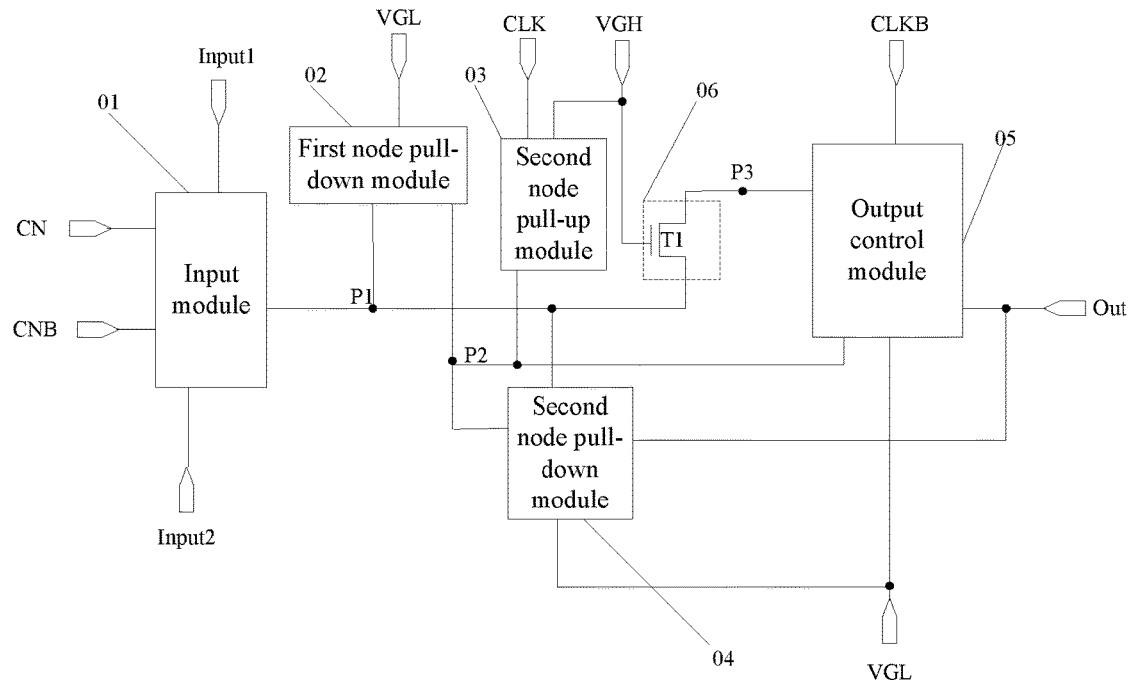
FIGS. 4-7 are schematic views showing the structures of the shift register according to some embodiments of the present disclosure.

During the implementation, as shown in FIG. 4, the output noise-reduction module 06 may include a first switching transistor T1, a gate electrode of which is connected to the high level signal end VGH, a source electrode of which is connected to the first node P1, and a drain electrode of which is connected to the third node P3.

To be specific, the gate electrode of the first switching transistor T1 is connected to the high level signal end VGH, so the first switching transistor T1 is always in an on state and functions as a single-transistor transmission gate. As a result, the first switching transistor T1 may be used to filter the signal from the first node P1 and decrease the noise included in the signal, and transmit the resultant signal to the third node P3.

Figure 5:
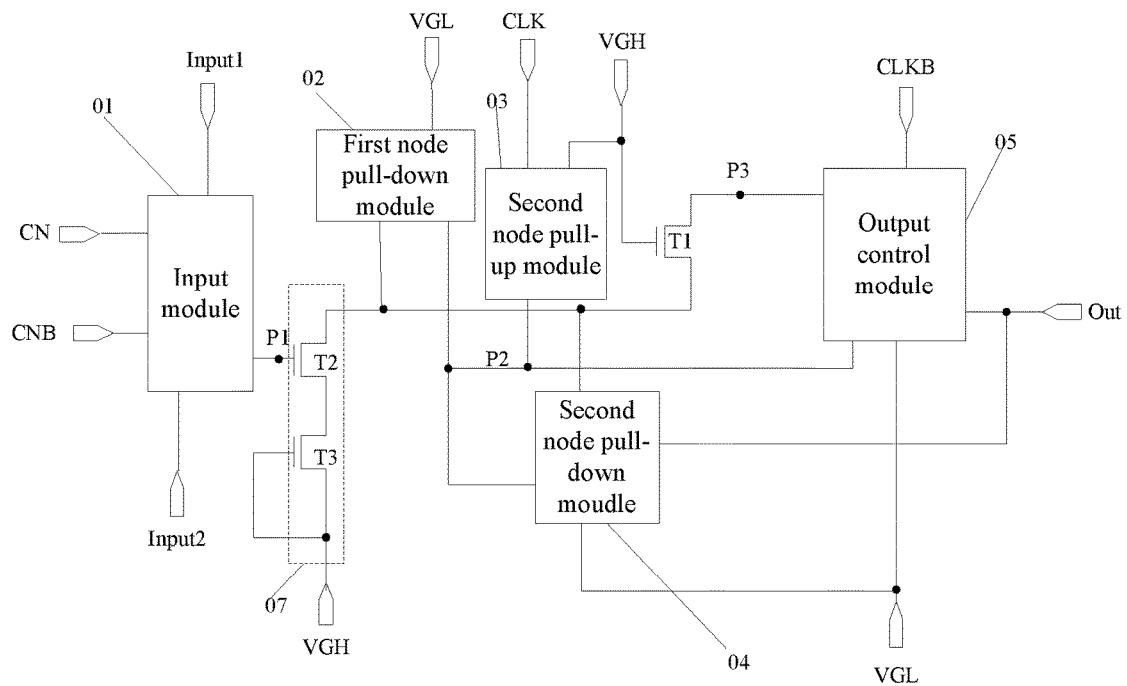

During the implementation, as shown in FIG. 5, the shift register may further include a first node noise-reduction module 07 connected among the first node P1, the high level signal end VGH and the source electrode of the first switching transistor T1, and configured to electrically connect the high level signal end VGH and the source electrode of the first switching transistor T1 under the control of the first node P1.

To be specific, when the potential at the first node is pulled up, the first node noise-reduction module 07 is used to electrically connect the high level signal end VGH and the source electrode of the first switching transistor T1, so as to pull up the signal from the first node P1 in a direct current form, thereby to further filter and the signal from the first node P1 and decrease the noise included in the signal, and output the resultant signal to the source electrode of the first switching transistor T1. Then, the signal is filtered by the first switching transistor T1, so as to further decrease the noise included in the signal, thereby to improve the loss-free transmission of the signal and reduce the power consumption.

During the implementation, as shown in FIG. 5, the first node noise-reduction module 07 may include a second switching transistor T2 and a third switching transistor T3. A gate electrode of the second switching transistor T2 is connected to the first node P1, a source electrode of the second switching transistor T2 is connected to a drain electrode of the third switching transistor T3, and a drain electrode of the second switching transistor T2 is connected to the source electrode of the first switching transistor T1. A gate electrode and a source electrode of the third switching transistor T3 are connected to the high level signal end VGH.

To be specific, when the potential at the first node P1 is pulled up, the second switching transistor T2 is in the on state. The gate electrode and the source electrode of the third switching transistor T3 are connected to the high level signal end VGH, so the third switching transistor T3 is always in the on state and functions as a single-transistor transmission gate. When the potential at the first node P1 is pulled up, the signal from the high level signal end VGH is outputted to the source electrode of the first switching transistor T1 through the third switching transistor T3 and the second switching transistor T2 which is in the on state, so as to pull up the signal from the source electrode of the first switching transistor T1 in a direct current form, thereby to further decrease the noise included in the signal rather than outputting the signal from the first node P1 whose noise is not decreased to the source electrode of the first switching transistor T1. In this way, it is able to reduce the noise included in the signal from the source electrode of the first switching transistor T1.

Figure 6:
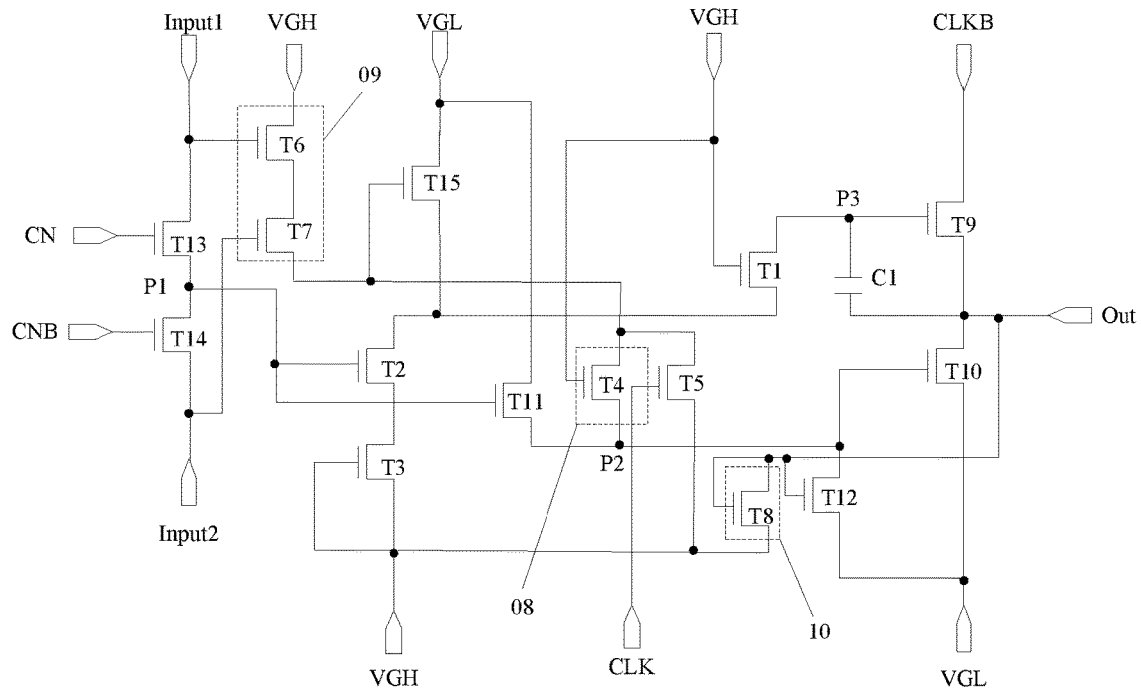
Figure 7:
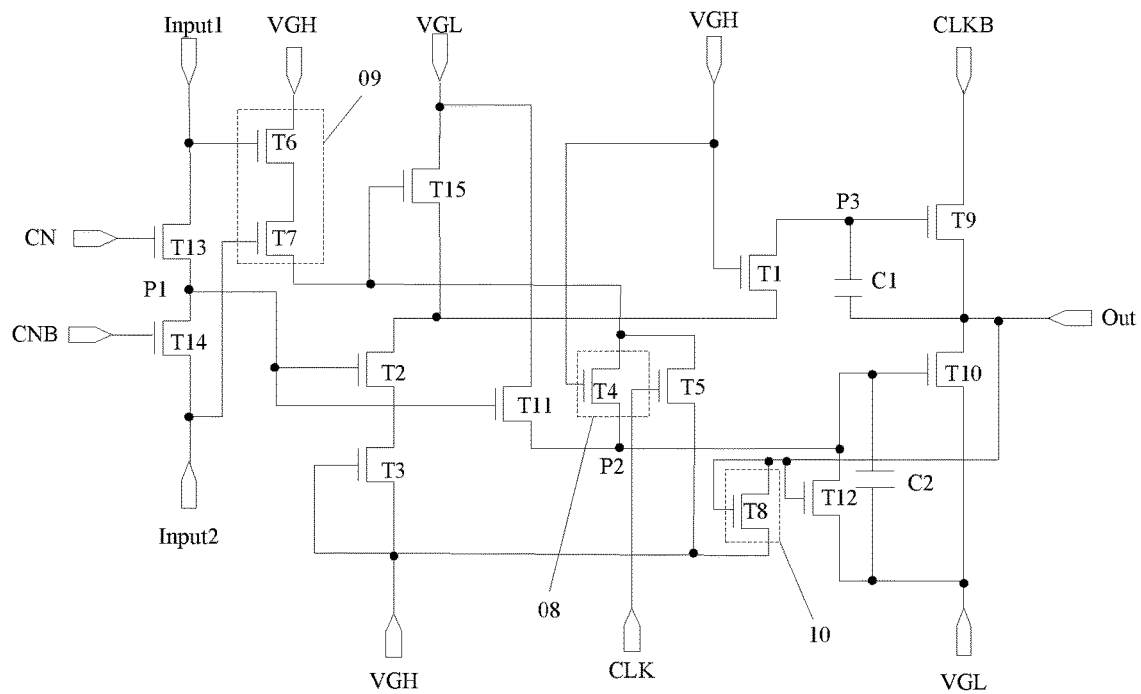

During the implementation, as shown in FIGS. 6 and 7, the shift register may further include a second node noise-reduction module 08 connected among the high level signal end VGH, the output end of the second node pull-up module 03 and the second node P2 and configured to filter a signal from the output end of the second node pull-up module 03 and decease the noise included in the signal, and output the resultant signal to the second node P2. As a result, it is able to reduce the noise included in the signal from the second node P2.

To be specific, the second node noise-reduction module 08 is always in the on state under the control of the high level signal end VGH, and functions as a transmission gate so as to filter the signal from the output end of the second node pull-up module 03 and decrease the noise included in the signal, and output the resultant signal to the second node P2, thereby to further reduce the noise included in the signal from the second node P2.

During the implementation, as shown in FIGS. 6 and 7, the second node noise-reduction module 08 may include a fourth switching transistor T4, a gate electrode of which is connected to the high level signal end VGH, a source electrode of which is connected to the output end of the second node pull-up module 03 and a drain electrode of which is connected to the second node P2.

To be specific, the gate electrode of the fourth switching transistor T4 is connected to the high level signal end VGH, so the fourth switching transistor T4 is always in the on state, and functions as a single-transistor transmission gate so as to filter the signal from the output end of the second node pull-up module 03 and decrease the noise included in the signal, and output the resultant signal to the second node P2, thereby to further reduce the noise included in the signal from the second node P2.

During the implementation, as shown in FIGS. 6 and 7, the second node pull-up module 03 may include a fifth switching transistor T5, a gate electrode of which is connected to the first clock signal end CLK, a source electrode of which is connected to the high level signal end VGH, and a drain electrode of which is connected to the source electrode of the fourth switching transistor T4.

To be specific, when a high level signal is inputted from the first clock signal end CLK, the fifth switching transistor T5 is in the on state and electrically connects the high level signal end VGH and the source electrode of the fourth switching transistor T4, so as to pull up the potential at the source electrode of the fourth switching transistor T4. At this time, it is able to pull up the potential at the second node P2 because the fourth switching transistor T4 is always in the on state.

During the implementation, as shown in FIGS. 6 and 7, the shift register may further include a protection module 09 connected among the first signal input end Input1, the second signal input end Input2, the high level signal end VGH and the output end of the second node pull-up module 03, and configured to divert an abnormal current signal when the abnormal current signal is inputted by the first signal input end Input1 or the second signal input end Input2.

To be specific, when the shift register operates normally, the protection module 09 is in an off state. The abnormal current signal is a large current signal greater than a normal current signal. For example, a normal current signal inputted by the signal input end is 1V, and when the current signal inputted by the signal input end is 10V, this signal is determined as the abnormal signal. When the first signal input end Input1 or the second signal Input1 end Input2 inputs an abnormal current signal, the large current signal may destroy the transistors in the shift register. The protection module 09 is provided herein to divert the abnormal current signal, so as to prevent the shift register from being damaged due to the abnormal current signal.

During the implementation, as shown in FIGS. 6 and 7, the protection module 09 may include a sixth switching transistor T6 and a seventh switching transistor T7. A gate electrode of the sixth switching transistor T6 is connected to the first signal input end Input1, a source electrode of the sixth switching transistor T6 is connected to the high level signal end VGH, and a drain electrode of the sixth switching transistor T6 is connected to a source electrode of the seventh switching transistor T7. A gate electrode of the seventh switching transistor T7 is connected to the second signal input end Input2, and a drain electrode of the seventh switching transistor is connected to the output end of the second node pull-up module 03.

To be specific, when the shift register operates normally, the protection module 09 is in the off state, and at this time, the sixth switching transistor T7 and the seventh switching transistor T7 are both in the off state. When the large current signal is inputted by the first signal input end Input1 or the second signal input end Input2, the corresponding sixth switching transistor T6 or seventh switching transistor T7 is in the on state, so as to divert and buff the abnormal current signal, thereby to prevent the shift register from being damaged due to the abnormal current signal.

During the implementation, as shown in FIGS. 6 and 7, the shift register may further include a maintenance module 10. An input end of the maintenance module 10 is connected to the high level signal end VGH, a control end and an output end of the maintenance module 10 are connected to the scanning signal output end Out, and the maintenance module 10 is configured to maintain a potential at the scanning signal output end Out when the scanning signal output end Out outputs the scanning signal.

To be specific, when the scanning signal output end Out outputs the scanning signal, the maintenance module 10 is in the on state, so as to electrically connect the high level signal end VGH and the scanning signal output end Out and output the high level signal to the scanning signal output end Out, thereby to maintain the potential at the scanning signal output end Out.

During the implementation, as shown in FIGS. 6 and 7, the maintenance module 10 may include an eighth switching transistor T8, a gate electrode and a drain electrode of which are connected to the scanning signal output end Out, and a source electrode of which is connected to the high level signal end VGH.

To be specific, when the scanning signal output end Out outputs the scanning signal, the eighth switching transistor T8 is in the on state, so as to electrically connect the high level signal end VGH and the scanning signal output end Out, thereby to further maintain the potential at the scanning signal output end Out.

During the implementation, as shown in FIGS. 6 and 7, the output control module 05 includes a first output control module 051 and a second output control module 052.

The first output control module 051 is connected among the third node P3, the second clock signal end CLKB and the scanning signal output end Out, and configured to control the scanning signal output end Out to output a signal from the second clock signal end CLKB under the control of the third node P3.

The second output control module 052 is connected among the low level signal end VGL, the second node P2 and the scanning signal output end Out, and configured to control the scanning signal output end Out to output a signal from the low level signal end VGL under the control of the second node P2.

To be specific, the first output control module 051 and the second output control module 051 outputs the signal from the second clock signal end CLKB and the signal from the low level signal end VGL under the control of the third node P3 and the second node P2, respectively, so as to enable the shift register to output the scanning signal to the corresponding gate line at a corresponding stage, thereby to drive the display panel to perform progressive scanning.

During the implementation, as shown in FIGS. 6 and 7, the first output control module 051 may include a ninth switching transistor T9 and a first capacitor C1. A gate electrode of the ninth switching transistor T9 is connected to the third node P3, a source electrode of the ninth switching transistor T9 is connected to the second clock signal end CLKB, and a drain electrode of the ninth switching transistor T9 is connected to the scanning signal output end Out. The first capacitor C1 is connected between the third node P3 and the scanning signal output end Out.

To be specific, when the potential at the third node P3 is pulled up, the ninth switching transistor T9 is in the on state, so as to electrically connect the second clock signal end CLKB and the scanning signal output end Out. Meanwhile, the first capacitor C1 may bootstrap the potential at the third node P3, thereby to further maintain the potential at the third node P3.

During the implementation, as shown in FIG. 6, the second output control module 052 may include a tenth switching transistor T10, a gate electrode of which is connected to the second node P2, a source electrode of which is connected to the low level signal end VGL, and a drain electrode of which is connected to the scanning signal output end Out.

To be specific, when the potential at the second node P2 is pulled up, the tenth switching transistor T10 is in the on state, so as to electrically connect the low level signal end VGL and the scanning signal output end Out. Meanwhile, it is also able to maintain the potential at the second node P2 through a parasitic capacitance of the tenth switching transistor T10.

During the implementation, as shown in FIG. 7, the second output control module 052 may further include a second capacitor C2 connected between the second node P2 and the low level signal end VGL.

To be specific, when the potential at the second node P2 is pulled up, the tenth switching transistor T10 is in the on state, so as to electrically connect the low level signal end VGL and the scanning signal output end Out. Meanwhile, the second capacitor C2 may be used to further maintain the potential at the second node P2 and reduce the noise included in the voltage signal from the second node P2.

During the implementation, as shown in FIGS. 6 and 7, the second node pull-down module 04 may include a first pull-down module 041 and a second pull-down module 042. An input end of the first pull-down module 041 is connected to the low level signal end VGL, a control end of the first pull-down module 041 is connected to the first node P1, an output end of the first pull-down module 041 is connected to the second node P2, and the first pull-down module 041 is configured to pull down the potential at the second node P2 under the control of the first node P1. An input end of the second pull-down module 042 is connected to the low level signal end VGL, a control end of the second pull-down module 042 is connected to the scanning signal output end Out, an output end of the second pull-down module 042 is connected to the second node P2, and the second pull-down module 042 is configured to further pull down the potential at the second node P2 when the scanning signal output end Out outputs the scanning signal.

To be specific, the first pull-down module 041 and the second pull-down module 042 are configured to pull down the potential at the second node P2 when the potential at the first node P1 is pulled up and the scanning signal output end Out outputs the scanning signal, so as to reduce the noise included in the signal from the second node P2.

During the implementation, as shown in FIGS. 6 and 7, the first pull-down module 041 may include an eleventh switching transistor T11, a gate electrode of which is connected to the first node P1, a source electrode of which is connected to the low level signal end VGL, and a drain electrode of which is connected to the second node P2.

To be specific, when the potential at the first node P1 is pulled up, the eleventh switching transistor T11 is in the on state, so as to electrically connect the low level signal end VGL, and the second node P2, thereby to pull down the potential at the second node P2 and reduce the noise included in the signal from the second node P2.

During the implementation, as shown in FIGS. 6 and 7, the second pull-down module 042 may include a twelfth switching transistor T12, a gate electrode of which is connected to the scanning signal output end Out, a source electrode of which is connected to the low level signal end VGL, and a drain electrode of which is connected to the second node P2.

To be specific, when the scanning signal output end Out outputs the scanning signal, the twelfth switching transistor T12 is in the on state, so as to electrically connect the low level signal end VGL and the second node P2, thereby to pull down the potential at the second node P2 and reduce the noise included in the signal from the second node P2.

During the implementation, as shown in FIGS. 6 and 7, the input module 01 may include a thirteenth switching transistor T13 and a fourteenth switching transistor T14. A gate electrode of the thirteenth switching transistor T13 is connected to the first reference signal end CN, a source electrode of the thirteenth switching transistor T13 is connected to the first signal input end Input1, and a drain electrode of the thirteenth switching transistor T13 is connected to a source electrode of the fourteenth switching transistor T14 and the first node P1. A gate electrode of the fourteenth switching transistor T14 is connected to the second reference signal end CNB, and a drain electrode of the fourteenth switching transistor T14 is connected to the second signal input end Input2.

To be specific, the gate electrodes of the thirteenth switching transistor T13 and the fourteenth switching transistor T14 are connected to the first reference signal end CN and the second reference signal end CNB respectively, so during the forward scanning, the thirteenth switching transistor T13 is in the on state, and when a signal is inputted by the first signal input end Input1, the thirteenth switching transistor T13 in the on state electrically connects the first signal input end Input1 and the first node P1, so as to output the signal from the first signal input end Input1 to the first node P1. During the backward scanning, the fourteenth switching transistor T14 is in the on state, and when a signal is inputted by the second signal input end Input2, the fourteenth switching transistor T14 in the on state electrically connects the second signal input end Input2 and the first node P1, so as to output the signal from the second signal input end Input2 to the first node P1.

During the implementation, as shown in FIGS. 6 and 7, the first node pull-down module 02 may include a fifteenth switching transistor T15, a gate electrode of which is connected to the output end of the second node pull-up module 03, a source electrode of which is connected to the low level signal end VGL, and a drain electrode of which is connected to the input end of the output noise-reduction module 06.

To be specific, when the potential at the second node P2 is pulled up, i.e., when the output end of the second node pull-up module 03 outputs a high level signal, the fifteenth switching transistor T15 is also in the on state, so as to electrically connect the low level signal end VGL, and the input end of the output noise-reduction module 06, thereby to further pull down the potential at the input end of the output noise-reduction module 06. At this time, it is able to pull down the potential at the third node P3 because the output noise-reduction module 06 is always in the on state.

It should be appreciated that, the transistors mentioned above may be thin film transistors (TFTs) or metal oxide semiconductor field effect transistors (MOSFETs). During the implementation, a source electrode and a drain electrode of each transistor may be replaced with each other. In the embodiments of the present disclosure, the TFTs are taken as an example.

Further, the first signal input end Input1 and the second signal input end Input2 of the shift register in the embodiments of the present disclosure are provided as a symmetrical design and the functions thereof may be replaced with each other, so the shift register may be used to achieve bidirectional scanning.

Usually, during the forward scanning, the first reference signal end CN provides a high level signal and the second reference signal end CNB provides a low level signal, and during the backward scanning, the first reference signal end CN provides a low level signal and the second reference signal end CNB provides a high level signal.

Figure 8:
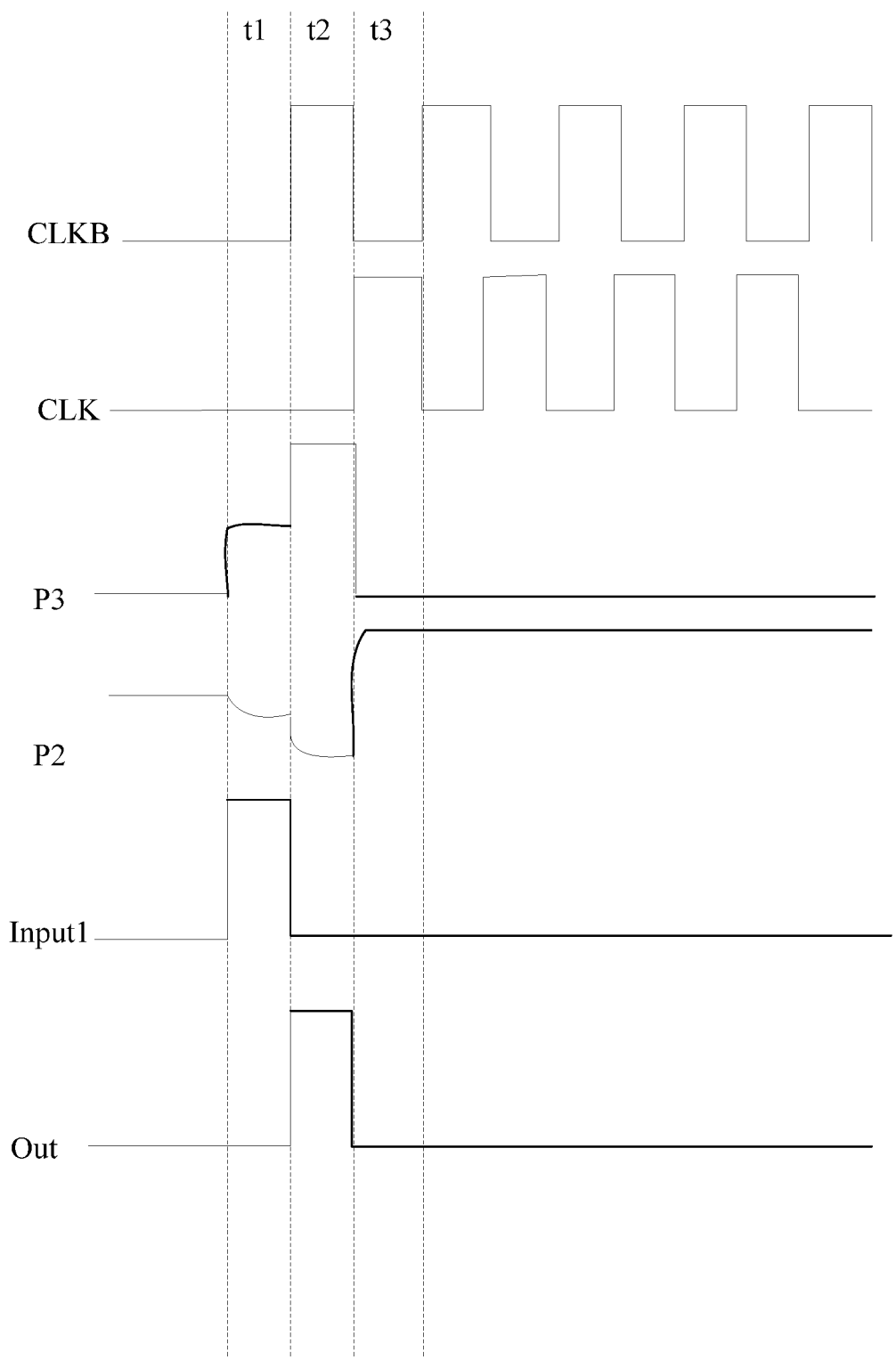
FIG. 8 is an input/output sequence diagram of the shift register according to some embodiments of the present disclosure.

A working procedure of the shift register will be described herein after by taking the forward scanning as an example in conjunction with FIGS. 7 and 8. To be specific, three stages t1-t3 in FIG. 8 are selected, where 1 represents a high level signal and 0 represents a low level signal.

At stage t1, Input1=1, CLKB=0, CLK=0, CN=1 and CNB=0. Because CN=1, the thirteenth switching transistor 1713 is in the on state, so as to electrically connect the first signal input end Input1 and the gate electrode of the second switching transistor 12. At this time, the second switching transistor T2 is in the on state. The third switching transistor T3 is always in the on state, so the signal from the high level signal end NIGH is outputted to the source electrode of the first switching transistor T1 through the third switching transistor T3 and the second switching transistor 12 in the on state. The first switching transistor T1 is always in the on state, so the signal from the first node P1 is filtered by the first switching transistor T1 and the noise included in the signal is decreased and then the resultant signal is outputted to the third node P3, so as to pull up the potential at the third node P3 and charge the first capacitor C1. At this time, the ninth switching transistor T9 is in the on state, so as to electrically connect the second clock signal end CLKB and the scanning signal output end Out. Because CLKB=0, the scanning signal output end Out outputs a low level signal. Stage t1 is a charging stage.

At stage t2, Input1=0, CLKB=1, CLK=0, CN=1 and CNB=0. Due to the bootstrapping effect of the first capacitor CL the potential at the third nod eP3 is further pulled up, so the ninth switching transistor T9 is still in the on state. At this time, CLKB=1, so the scanning signal output end Out outputs a high level signal. Stage t2 is a scanning signal output stage.

At stage t3, Input1=0, CLKB=0, CLK=1; CN=1 and CNB=0. Because CLK=1, the fifth switching transistor T5 is in the on state, so as to electrically connect the high level signal end VGH and the source electrode of the fourth switching transistor T4. The fourth switching transistor T4 is always in the on state, so the signal from the high level signal end VGH is filtered and the noise included in the signal is decreased, and then the resultant signal is outputted to the second node P2, so as to pull up the potential at the second node P2. At this time, the tenth switching transistor T10 is in the on state so as to electrically connect the low level signal end VGL and the scanning signal output end Out, so the scanning signal output end Out outputs a low level signal. Meanwhile, the potential at the source electrode of the fourth switching transistor T4 is pulled up, so the fifteenth switching transistor T15 is in the on state so as to electrically connect the source electrode of the first switching transistor T1 and the low level signal end VGL, thereby to pull down the potential at the source electrode of the first switching transistor T1. Because the first switching transistor T1 is always in the on state, the potential at the third node P3 is pulled down, and the ninth switching transistor T9 is in the off state. Stage t3 is a stage where no scanning signal is output.

Subsequently, the scanning signal output end Out outputs the low level signal continuously, and when the high level signal is inputted by the first signal input end Input1 again within a certain period, the above working procedure will be repeated by the shift register.

Based on an identical inventive concept, the present disclosure provides in some embodiments a gate driver circuit including a plurality of the above-mentioned shift registers arranged in a cascaded manner, and apart from the last shift register, a triggering signal is inputted by a scanning signal output end of each shift register into a signal input end of a next shift register.

Figure 9:
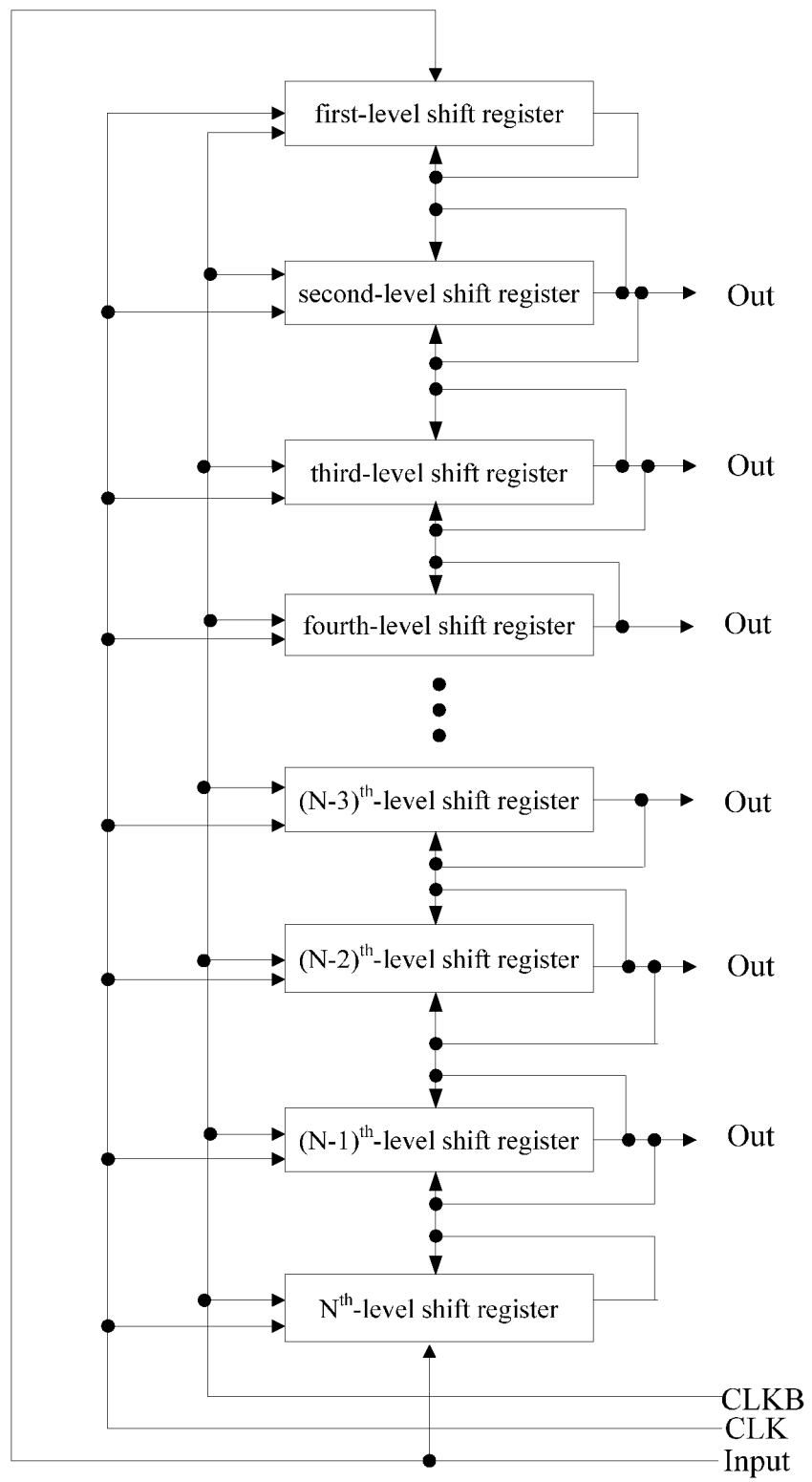
FIG. 9 is a schematic view showing a gate driver circuit according to some embodiments of the present disclosure.

For ease of the description, merely eight shift registers are shown in FIG. 9, including a first-level shift register, a second-level shift register, a third-level shift register, a fourth-level shift register, an $(N-3)^{th}$-level shift register, an $(N-2)^{th}$-level shift register, an $(N-1)^{th}$-level shift register and an $N^{th}$-level shift register. Apart from the $N^{th}$ shift register, the scanning signal output end Out of each shift register outputs a start signal to the gate line connected thereto as well as a triggering signal to a nest-level shift register.

To be specific, the function and structure of each shift register in the gate driver circuit is identical to that mentioned above, and thus will not be repeated herein.

Based on an identical inventive concept, the present disclosure provides in some embodiments a display panel including the above-mentioned gate driver circuit. The principle of the display panel for solving the problems is identical to that of the gate driver circuit, so the implementation of the display panel may refer to that of the gate driver circuit and thus will not be repeated herein.

Based on an identical inventive concept, the present disclosure provides in some embodiments a display device including the above-mentioned display panel. The display device may be applied to any product or member having a display function, such as a mobile phone, a flat-panel computer, a television, a display, a laptop computer, a digital photo frame or a navigator. The principle of the display device for solving the problems is identical to that of the display panel, so the implementation of the display device may refer to that of the display panel and thus will not be repeated herein.

According to the shift register, the gate driver circuit, the display panel and the display device in the embodiments of the present disclosure, the shift register includes the input module, the first node pull-down module, the second node pull-up module, the second node pull-down module, the output control module and the output noise-reduction module. The input module is configured to pull up the potential at the first node under the control of signal input end. The first node pull-down module is configured to pull down the potential at the first node under the control of the second node. The second node pull-up module is configured to pull up the potential at the second node under the control of the first clock signal end. The second node pull-down module is configured to pull down the potential at the second node under the control of the first node and the scanning signal output end. The output control module is configured to control the scanning signal output end to output the signal from the second clock signal end or the signal from the low level signal end under the control of the third node and the second node. In this way, it is able for the shift register to output the scanning signal at a corresponding stage. Meanwhile, the output noise-reduction module is configured to filter the signal from the first node and decrease the noise included in the signal, and output the resultant signal to the third node, so as to enable the output control module to output a low-noise scanning signal under the control of the third node, and prevent the scanning signal output end from outputting a noisy signal under the control of the first capacitor in the presence of the noisy signal. As a result, it is able to achieve the loss-free transmission of the signal and reduce the power consumption, thereby to improve the yield of the display panel.

The above are merely the preferred embodiments of the present disclosure. Obviously, a person skilled in the art may make further modifications and improvements without departing from the principle of the present disclosure, and these modifications and improvements shall also fall within the scope of the present disclosure.

What is claimed is:

1. A shift register, comprising an input module, a first node pull-down module, a second node pull-up module, a second node pull-down module, an output control module and an output noise-reduction module, wherein
    a first input end of the input module is connected to a first signal input end, a second input end of the input module is connected to a second signal input end, a first control end of the input module is connected to a first reference signal end, a second control end of the input module is connected to a second reference signal end, an output end of the input module is connected to a first node, and the input module is configured to pull up a potential at the first node under the control of the first reference signal end or the second reference signal end;
    an input end of the first node pull-down module is connected to a low level signal end, a control end of the first node pull-down module is connected to a second node, an output end of the first node pull-down module is connected to the first node, and the first node pull-down module is configured to pull down the potential at the first node under the control of the second node;
    an input end of the second node pull-up module is connected to a high level signal end, a control end of the second node pull-up module is connected to a first clock signal end, an output end of the second node pull-up module is connected to the second node, and the second node pull-up module is configured to pull up a potential at the second node under the control of the first clock signal end;
    a first input end and a second input end of the second node pull-down module are connected to the low level signal end, a first control end of the second node pull-down module is connected to the first node, a second control end of the second node pull-down module is connected to a scanning signal output end, an output end of the second node pull-down module is connected to the second node, and the second node pull-down module is configured to pull down the potential at the second node under the control of the first node or the scanning signal output end;
    a first input end of the output control module is connected to the low level signal end, a second input end of the output control module is connected to a second clock signal end, a first control end of the output control module is connected to a third node, a second control end of the output control module is connected to the second node, an output end of the output control module is connected to the scanning signal output end, and the output control module is configured to control the scanning signal output end to output a signal from the second clock signal end or a signal from the low level signal end under the control of the third node or the second node; and
    an input end of the output noise-reduction module is connected to the first node, a control end of the output noise-reduction module is connected to the high level signal end, an output end of the output noise-reduction module is connected to the third node, and the output noise-reduction module is configured to filter a signal from the first node and decrease a noise included in the signal, and then output the resultant signal to the third node.

2. The shift register according to claim 1, wherein the output noise-reduction module comprises a first switching transistor, a gate electrode of which is connected to the high level signal end, a source electrode of which is connected to the first node, and a drain electrode of which is connected to the third node.

3. The shift register according to claim 1, further comprising a first node noise-reduction module connected among the first node, the high level signal end and the source electrode of a first switching transistor and configured to further filter the signal from the first node and decrease the noise included in the signal, and then output the resultant signal to the source electrode of the first switching transistor.

4. The shift register according to claim 3, wherein the first node noise-reduction module comprises a second switching transistor and a third switching transistor;
    a gate electrode of the second switching transistor is connected to the first node, a source electrode of the second switching transistor is connected to a drain electrode of the third switching transistor, and a drain electrode of the second switching transistor is connected to the source electrode of the first switching transistor; and
    a gate electrode and a source electrode of the third switching transistor are connected to the high level signal end.

5. The shift register according to claim 1, further comprising a second node noise-reduction module connected among the high level signal end, the output end of the second node pull-up module and the second node and configured to filter a signal from the output end of the second node pull-up module and decrease the noise included in the signal, and output the resultant signal to the second node.

6. The shift register according to claim 5, wherein the second node noise-reduction module comprises a fourth switching transistor, a gate electrode of which is connected to the high level signal end, a source electrode of which is connected to the output end of the second node pull-up module and a drain electrode of which is connected to the second node.

7. The shift register according to claim 6, wherein the second node pull-up module comprises a fifth switching transistor, a gate electrode of which is connected to the first clock signal end, a source electrode of which is connected to the high level signal end, and a drain electrode of which is connected to the source electrode of the fourth switching transistor.

8. The shift register according to claim 1, further comprising a protection module connected among the first signal input end, the second signal input end, the high level signal end and the output end of the second node pull-up module, and configured to divert an abnormal current signal when the abnormal current signal is inputted by the first signal input end or the second signal input end.

9. The shift register according to claim 8, wherein the protection module comprises a sixth switching transistor and a seventh switching transistor;
- a gate electrode of the sixth switching transistor is connected to the first signal input end, a source electrode of the sixth switching transistor is connected to the high level signal end, and a drain electrode of the sixth switching transistor is connected to a source electrode of the seventh switching transistor; and
- a gate electrode of the seventh switching transistor is connected to the second signal input end, and a drain electrode of the seventh switching transistor is connected to the output end of the second node pull-up module.

10. The shift register according to claim 1, further comprising a maintenance module, an input end of the maintenance module is connected to the high level signal end, a control end and an output end of the maintenance module are connected to the scanning signal output end, and the maintenance module is configured to maintain a potential at the scanning signal output end when the scanning signal output end outputs the scanning signal.

11. The shift register according to claim 10, wherein the maintenance module comprises an eighth switching transistor, a gate electrode and a drain electrode of which are connected to the scanning signal output end, and a source electrode of which is connected to the high level signal end.

12. The shift register according to claim 1, wherein the output control module comprises a first output control module and a second output control module;
- the first output control module is connected among the third node, the second clock signal end and the scanning signal output end, and configured to control the scanning signal output end to output a signal from the second clock signal end under the control of the third node; and
- the second output control module is connected among the low level signal end, the second node and the scanning signal output end, and configured to control the scanning signal output end to output a signal from the low level signal end under the control of the second node.

13. The shift register according to claim 12, wherein the first output control module comprises a ninth switching transistor and a first capacitor;
- a gate electrode of the ninth switching transistor is connected to the third node, a source electrode of the ninth switching transistor is connected to the second clock signal end, and a drain electrode of the ninth switching transistor is connected to the scanning signal output end; and
- the first capacitor is connected between the third node and the scanning signal output end.

14. The shift register according to claim 12, wherein the second output control module comprises a tenth switching transistor, a gate electrode of which is connected to the second node, a source electrode of which is connected to the low level signal end, and a drain electrode of which is connected to the scanning signal output end.

15. The shift register according to claim 14, wherein the second output control module further comprises a second capacitor connected between the second node and the low level signal end.

16. The shift register according to claim 1, wherein the second node pull-down module comprises a first pull-down module and a second pull-down module;
- an input end of the first pull-down module is connected to the low level signal end, a control end of the first pull-down module is connected to the first node, an output end of the first pull-down module is connected to the second node, and the first pull-down module is configured to pull down the potential at the second node under the control of the first node; and
- an input end of the second pull-down module is connected to the low level signal end, a control end of the second pull-down module is connected to the scanning signal output end, an output end of the second pull-down module is connected to the second node, and the second pull-down module is configured to further pull down the potential at the second node when the scanning signal output end outputs the scanning signal.

17. The shift register according to claim 16, wherein the first pull-down module comprises an eleventh switching transistor, a gate electrode of which is connected to the first node, a source electrode of which is connected to the low level signal end, and a drain electrode of which is connected to the second node.

18. The shift register according to claim 16, wherein the second pull-down module comprises a twelfth switching transistor, a gate electrode of which is connected to the scanning signal output end, a source electrode of which is connected to the low level signal end, and a drain electrode of which is connected to the second node.

19. The shift register according to claim 1, wherein the input module comprises a thirteenth switching transistor and a fourteenth switching transistor;
- a gate electrode of the thirteenth switching transistor is connected to the first reference signal end, a source electrode of the thirteenth switching transistor is connected to the first signal input end, and a drain electrode of the thirteenth switching transistor is connected to a source electrode of the fourteenth switching transistor and the first node; and
- a gate electrode of the fourteenth switching transistor is connected to the second reference signal end, and a drain electrode of the fourteenth switching transistor is connected to the second signal input end.

20. The shift register according to claim 1, wherein the first node pull-down module comprises a fifteenth switching transistor, a gate electrode of which is connected to the output end of the second node pull-up module, a source electrode of which is connected to the low level signal end, and a drain electrode of which is connected to the input end of the output noise-reduction module.

21. A gate driver circuit comprising a plurality of the shift registers according to claim 1 arranged in a cascaded manner, wherein apart from the last shift register, a triggering signal is inputted by a scanning signal output end of each shift register into a signal input end of a next shift register.

22. A display device comprising a display panel, wherein the display panel includes the gate driver circuit according to claim 21.

* * * * *